United States Patent [19]

Bhandari et al.

[11] Patent Number: 5,404,139
[45] Date of Patent: Apr. 4, 1995

[54] SERIAL DATA DECODER

[75] Inventors: Rajan Bhandari; Jonathan M. Soloff, both of Basingstoke; Jonathan J. Stone, Reading, all of United Kingdom

[73] Assignee: Sony United Kingdom Ltd., Staines

[21] Appl. No.: 924,925

[22] Filed: Aug. 5, 1992

[30] Foreign Application Priority Data

Oct. 4, 1991 [GB] United Kingdom ............... 9121123

[51] Int. Cl.6 ................... H03M 7/40; H03M 13/22
[52] U.S. Cl. .......................... 341/81; 341/67; 341/106
[58] Field of Search .............. 341/81, 50, 65, 67, 341/106

[56] References Cited

U.S. PATENT DOCUMENTS 4,394,642  7/1983  Currie et al. ................... 341/81
5,220,325  6/1993  Ackland et al. ................ 341/106 X
5,243,342  9/1993  Kattemalalavadi et al. ....... 341/106

*Primary Examiner*—Sharon D. Logan
*Attorney, Agent, or Firm*—William S. Frommer; Alvin Sinderbrand

[57] ABSTRACT

A serial data decoder is described for decoding interleaved variable length and fixed length codes. The decoder includes a state machine which moves between a branching hierarchy of states in dependence upon the bits of received serial data. When the state machine reaches a state corresponding to a complete variable length code having been received, it then enters a delay state lasting for the length of time necessary to receive the following fixed length code prior to return to a reset state. The state machine can be implemented using a static ram 10 storing data including pointers for controlling the movements between states.

9 Claims, 3 Drawing Sheets

| [RUNLENGTH/SIZE] | Huffman Code. | Length of Huffman Code. |
|---|---|---|
| 0/0 | 1010 | 4 |
| 0/1 | 00 | 2 |
| 0/2 | 01 | 2 |
| 0/3 | 100 | 3 |
| 0/4 | 1011 | 4 |
| 0/5 | 11010 | 5 |
| 0/6 | 111000 | 6 |
| 0/7 | 1111110110 | 10 |

SERIAL DATA DECODER

BACKGROUND OF THE INVENTION

1. Field of the Invention

This invention relates to the field of serial data decoding. More particularly, this invention relates to the field of the decoding of serial data composed of interleaved variable length codes and fixed length codes.

2. Description of the Prior Art

It is known to provide data encoding techniques which generate serial data in the form of interleaved variable length codes and fixed length codes. An example of such an encoding technique is that proposed by the Joint Photographic Experts Group (JPEG) and currently under review by the International Standards Organisation.

The JPEG standard is intended for the compression of image data in computer systems. The image data is transformed into the spatial frequency domain by discrete cosine transformation. The ac spatial components have a distinctly different character to the dc spatial components. The ac spatial components are subject to runlength coding to exploit the long runs of zero values in this data. The dc spatial components do not show this characteristic.

The JPEG standard proposes the use of code words with the following syntax for the ac data, i.e.

[RUNLENGTH, SIZE], [AMPLITUDE]

In this case RUNLENGTH is the number of zeros preceding a non-zero value. SIZE is the number of bits that will be needed to represent the non-zero value. AMPLITUDE is the non-zero value and has a bit length equal to that specified by SIZE.

Consider the following data stream of image data,

... 0,0,0,7,0,0,0,0,0,0,11,0,0,0, ...

The middle portion, comprising six zeros followed by a non-zero value of 11, would be encoded with the value of RUNLENGTH=6. The non-zero value of 11 will require four bits to represent it, and so SIZE=4. The value, of AMPLITUDE is 11, or 1011 in binary. Thus, the sequence 0,0,0,0,0,0,11 is encoded as [6,4], [11].

The JPEG standard proposes the use of code words with the following syntax for the dc data, i.e.

[SIZE], [AMPLITUDE]

Each data value is encoded separately with SIZE being equal to the number of bits needed to represent the value and AMPLITUDE being the value itself. A dc data value of 5 would require three bits to represent and so SIZE=3. AMPLITUDE would then equal 5 or 101 in binary.

Having being coded from its raw state into either [RUNLENGTH, SIZE], [AMPLITUDE] or [SIZE], [AMPLITUDE] word pairs, the first word of each word pair is then subject to Huffman coding to exploit the fact that certain word are more common than others. Frequently occurring words are given short Huffman codes, whereas infrequently occurring words are given longer codes. Huffman coding is of the type of coding in which no valid code is a prefix of any longer valid code.

Whilst the JPEG standard gives good compression it does raise problems when decoding the compressed data. As the Huffman codes have differing lengths, it is not possible for a decoder working its way through the serial data stream to know how many bits will make up the next Huffman code. Huffman codes are of the type in which no code is a prefix of a longer code, but even so each new bit of serial data read may or may not be the final bit of a complete valid Huffman code. The Huffman codes are variable length codes as seen by the decoder.

This problem is not so great with the [AMPLITUDE] words. Whilst these words do have differing numbers of bits, their length is specified in the SIZE value of the preceding word in each word pair. Thus, the decoder can read the value of SIZE from the preceding word and known how many bits make up the [AMPLITUDE] word. The [AMPLITUDE] words are fixed length codes as seen by the decoder.

The problems of coping with this serial data stream comprising interleaved variable length codes and fixed length codes are not too great in the non-real time image display systems of the computers for which the JPEG standard is primarily intended. In a computer system the serial data stream can be read into memory and then scanned to identify valid variable length Huffman codes as a separate, non-synchronous operation.

However, problems do arise if you try to use the JPEG standard type data stream in real time systems such as video systems. In these circumstances the video system must cope with a continuous stream of encoded image data which has to be decoded on a real time basis with as little delay as possible.

It is an object of the invention to provide a serial data decoder capable of the high speed decoding of variable length code words.

SUMMARY OF THE INVENTION

Viewed from one aspect the invention provides a serial data decoder for decoding interleaved variable length codes and fixed length codes, said serial data decoder comprising:

a state machine responsive to received bits of serial data so as to move between states within a branching hierarchy of states starting from a reset state, said branching hierarchy being such that each bit of a variable length code controls which succeeding state is adopted until a state corresponding to a complete variable length code is reached, whereupon said state machine enters a delay state for a period specified by said complete variable length code as being equal to the length of a following fixed length code and after which return is made to said reset state.

This state machine approach exploits the fact that no valid variable length code is a prefix of a longer valid variable length code. Accordingly, a synchronous sequential state machine system can move between uniquely defined states until a valid variable length code is reached. The state machine approach also integrates the handling of the fixed length codes with that of the variable length codes by entering a delay state defined by the preceding variable length code. The state machine approach allows a high speed, and yet relatively simple, hardware implementation of the decoding. This enables the high data rates associated with the real time processing of video data to be handled.

A particularly efficient way of implementing the invention is one in which said state machine includes a memory with address locations within said memory corresponding to states of said state machine and storing data for controlling the next address location to be read and state entered. In this way a standard memory can be adapted by virtue of the data it stores to form the large branching hierarchy needed to cope with all the possible codes.

In a state machine the choice of which state should be adopted next is dependent upon the current state and an input variable. In preferred embodiments of the invention this can be implemented by providing that in states during receipt of a variable length code, data from a currently read address location is combined with the next received bit of serial data to derive the next address location to be read.

The integration of the handling of the fixed length codes can be achieved by providing that during said delay state a predetermined sequence of address locations are read until an address location storing data triggering return to said reset state is reached.

Rather than have to provide a separate mapping function to derive the decoded version of the variable length codes from the state reached by the state machine, in at least one of those states following receipt of said complete variable length code and prior to return to said reset state, the data read from said memory is a decoded version of said complete variable length code.

The word pairs of variable and fixed length codes can be collected together for further processing by providing a latch for storing a decoded version of said complete variable length code and a shift register into which said following fixed length code is read during said delay state, so that after receipt of said following fixed length code, said fixed length code is read from said shift register at the same time as said decoded version of said complete variable length code is read from said latch.

Viewed from another aspect the present invention provides a serial data decoding method for decoding interleaved variable length codes and fixed length codes, said serial data decoding method comprising the steps of:
  (i) moving a state machine in response to received bits of serial data between states within a branching hierarchy of states starting from a reset state, said branching hierarchy being such that each bit of a variable length code controls which succeeding state is adopted;
  (ii) when a state corresponding to a complete variable length code is reached, entering said state machine into a delay state for a period specified by said complete variable length code as being equal to the length of a following fixed length code;
  (iii) and thereafter returning to said reset state.

The above, and other objects, features and advantages of this invention will be apparent from the following detailed description of illustrative embodiments which is to be read in connection with the accompanying drawings.

DESCRIPTION OF THE PREFERRED EMBODIMENTS

Figures 1, 3:
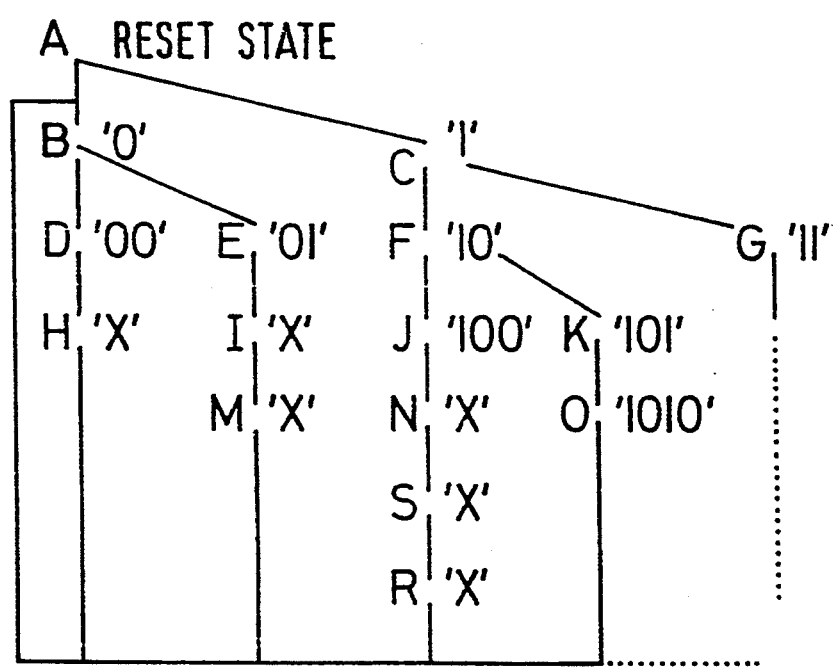
FIG. 1 illustrates the relationship between code words, Huffman codes and the length of the resulting code.
FIG. 3 illustrates the branching hierarchy of states of the state machine of FIG. 2.

FIG. 1 shows a column of [RUNLENGTH/SIZE] code words 2 with their corresponding Huffman codes 4. The differing bit lengths of the Huffman codes are shown in column 6. It will be noted that the code words [0/0] and [0/2] are the most common and so their corresponding Huffman codes are chosen to be the shortest. All of the [RUNLENGTH/SIZE] code words shown in column 2 have a zero runlength value.

Figure 2:
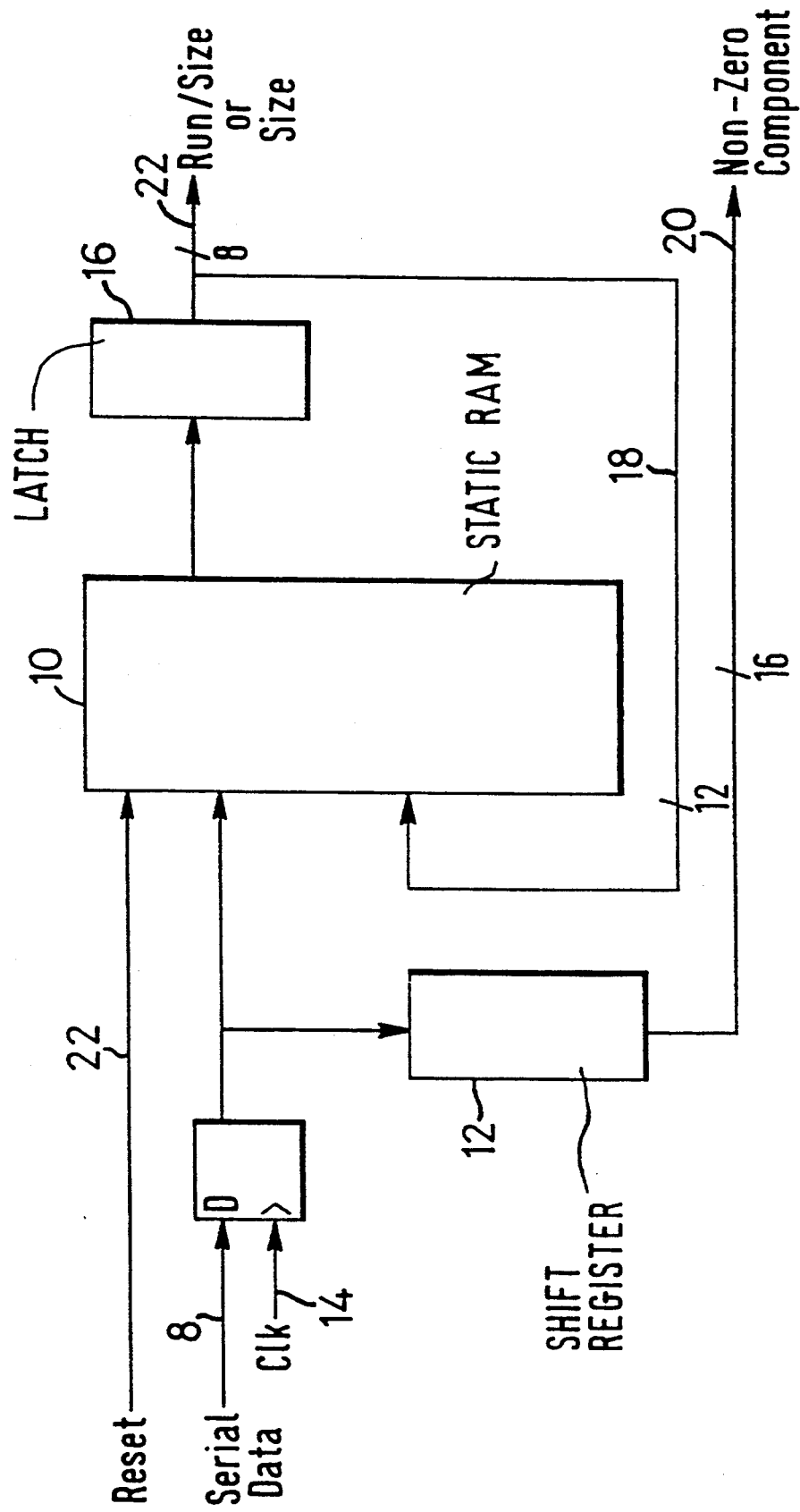
FIG. 2 illustrates a state machine for effecting decoding.

FIG. 2 schematically illustrates a state machine for decoding the interleaved fixed lengths codes and variable length codes. The stream of input data is input along line 8, from where they are clocked into a static ram 10 and shift register 12 under the control of clock signal 14.

The contents of the currently addressed memory location within the static ram 10 are fed to multibit latch 16. Twelve bits of the data stored in the multibit latch 16 are fedback to the static ram 10 along line 18. The shift register 12 is sixteen bits long and continuously reads in and discards bits of serial data in time with clock signal 14. The sixteen bits stored in the shift register 12 are output on line 20. A reset signal can be applied to the static ram 10 along line 22 to force the static ram back into its reset condition.

Starting from the reset position, the input serial data acting in conjunction with the current state fedback along line 18 serve to control the movement of the static ram between states within a branching hierarchy of states. Each bit of serial data is combined with the twelve bits fed back along line 18 to derive the next address location within the static ram 10 to be read.

Once a complete variable length code has been received the static ram 10 enters a delay state in which a number of address locations are successively read followed by a return to the reset state. The number of address locations read during this delay state corresponds to the number of bits within the fixed length code following the variable length code. Since the variable length code has already been received and this uniquely identifies the number of bits within the following fixed length code, then the length of the fixed length code is known to the decoder.

During the delay state the fixed length code is read into the least significant bit positions within the shift register 12. At the end of the delay period the final address location read will include data defining the [RUNLENGTH/SIZE] code word. Each of the fields RUNLENGTH and SIZE has a four bit width and accordingly the overall width of the code word is eight bits. This eight bit word is read from output 22.

At the same time the bits within the shift register 12 can be read. These will include the fixed length code as the least significant bits. At the end of the delay state a return is made to the reset state.

FIG. 3 illustrates the branching hierarchy of states of the state machine of FIG. 2. State A is the reset state. The first bit of the variable length code word received will be either a "0" or a "1". This controls which of states B or C is adopted next. Similarly, subsequent received bits of serial data will control the direction of branching through the hierarchy until a state corresponding to a valid variable length code is reached, e.g. one of states D, E, J or O.

Once the valid variable length code has been received, a sequence of delay states signified by "X"s are passed through until a return is made to the reset state A.

By way of example, consider the case of the decoding of the word [0/3]. This word is represented by the binary Huffman code 100. The three bits of the Huffman code are sequentially received leading to the adoption of state J by the state machine having past through states C and F. The code [0/3] specifies that the following fixed length code has a bit length of three. Accordingly, three delay states, N, S and R, are pasted through prior to returning to reset state A. During the three delay states the fixed length code is clocked into the shift register 12 for subsequent reading via line 20.

At the end of each word pair both the variable length code and the fixed length code are simultaneously available on lines 22 and 20 respective.

Figure 4:
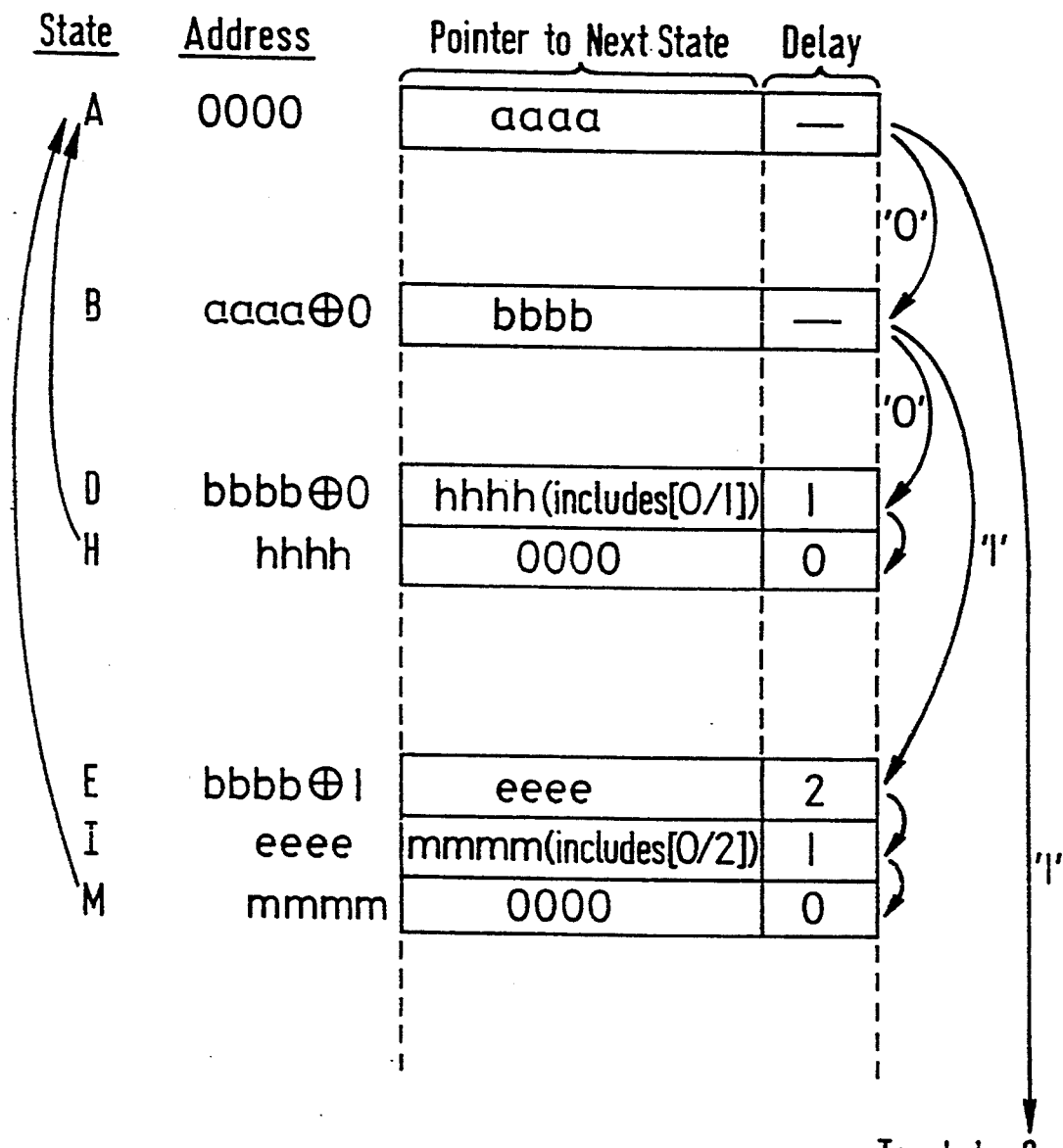
FIG. 4 illustrates the movement between states of the state machine of FIG. 2.

FIG. 4 schematically illustrates the content of the memory locations within the static ram 10 and the movement between the various memory locations read. Each memory locations stores a number of bits (e.g. eight bits) giving the pointer to the next state and a number of bits (e.g. 4 bits) to act as a delay state counter.

The system starts from state A with the first memory address '0000' being read. This address location includes a pointer 'aaaa' which is read and combined with the next bit of serial data received to derive the address of the next memory location to be read. If the next bit of serial data received is a "0", then state B is entered with the address location derived from the combination aaaa and "0" being read. The combination function is illustrated in the diagram by a plus sign within a circle. If the next bit of serial data read is a "1", then the system adopts state C (not illustrated). From state B the system will pass to either state D or state E depending on whether a "0" or "1" is received.

State D corresponds to a complete variable length code and the pointer to the next state also includes data identifying the variable length code as [0/1] (eight bits needed). A single delay state H is adopted prior to return to the reset state A.

State E corresponds to a complete variable length code specifying that the following fixed length code has a bit length of two. Accordingly, two delay states I and M are passed through prior to returning to reset state A.

As mentioned above, each of the memory locations includes a portion corresponding to a delay counter which indicates the number of delay states to be passed through prior to returning to the reset state A. When the delay count reaches zero, the state machine produces a signal to trigger the reading of both the variable length code and the fixed length code from respective ones of the latch 16 and the shift register 12.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A serial data decoder for decoding interleaved variable length codes and fixed length codes, said serial data decoder comprising:

a state machine responsive to received bits of serial data so as to move between states within a branching hierarchy of states starting from a reset state, said branching hierarchy being such that each bit of a variable length code controls which succeeding state is adopted until a state corresponding to a complete variable length code is reached, whereupon said state machine enters a delay state for a period that is dependent upon said complete variable length code as being equal to the length of a following fixed length code and after which return is made to said reset state.

2. A serial data decoder as claimed in claim 1, wherein said state machine includes a memory with address locations within said memory corresponding to states of said state machine and storing data for controlling the next address location to be read and state entered.

3. A serial data decoder as claimed in claim 2, wherein in states during receipt of a variable length code, data from a currently read address location is combined with the next received bit of serial data to derive the next address location to be read.

4. A serial data decoder as claimed in claim 2, wherein during said delay state a predetermined sequence of address locations are read until an address location storing data triggering return to said reset state is reached.

5. A serial data decoder as claimed in claim 2, wherein in at least one of those states following receipt of said complete variable length code and prior to return to said reset state, the data read from said memory includes a decoded version of said complete variable length code.

6. A serial data decoder as claimed in claim 5, further comprising a latch for storing a decoded version of said complete variable length code.

7. A serial data decoder as claimed in claim 1, wherein said state machine includes a shift register into which said following fixed length code is read during said delay state.

8. A serial data decoder as claimed in claim 6, wherein said state machine includes a shift register into which said following fixed length code is read during said delay state and after receipt of said following fixed length code, said state machine produces a signal for simultaneously triggering said fixed length code to be read from said shift register and said decoded version of said complete variable length code to be read from said latch.

9. A serial data decoding method for decoding interleaved variable length codes and fixed length codes, said serial data decoding method comprising the steps of:

(i) moving a state machine in response to received bits of serial data between states within a branching hierarchy of states starting from a reset state, said branching hierarchy being such that each bit of a variable length code controls which succeeding state is adopted;

(ii) when a state corresponding to a complete variable length code is reached, entering said state machine into a delay state for a period that is dependent upon said complete variable length code as being equal to the length of a following fixed length code; and (iii) thereafter returning to said reset state.

* * * * *